United States Patent [19]

Manasevit et al.

[11] 4,066,481
[45] Jan. 3, 1978

[54] METALORGANIC CHEMICAL VAPOR DEPOSITION OF IVA-VIA COMPOUNDS AND COMPOSITE

[75] Inventors: Harold M. Manasevit, Anaheim; William I. Simpson, Orange, both of Calif.

[73] Assignee: Rockwell International Corporation, El Segundo, Calif.

[21] Appl. No.: 647,222

[22] Filed: Jan. 7, 1976

Related U.S. Application Data

[62] Division of Ser. No. 523,599, Nov. 11, 1974, abandoned.

[51] Int. Cl.$^2$ .................... H01L 21/205; H01L 21/84
[52] U.S. Cl. .................... 148/174; 136/89 TF; 156/610; 156/613; 156/614; 148/175; 252/62.3 S; 252/62.3 V; 357/4; 357/16; 357/30; 423/508; 423/509; 427/87; 427/90; 427/91; 427/248 B
[58] Field of Search ............. 148/175, 174; 156/610, 156/612–614, 600, DIG. 72, 85; 252/62.35 V; 427/87, 90, 91, 248; 357/4, 16, 30; 423/508, 509; 136/89

[56] References Cited

U.S. PATENT DOCUMENTS

| | | | |
|---|---|---|---|
| 3,312,571 | 4/1967 | Ruehrwein | 148/175 |
| 3,403,133 | 9/1968 | Frederic et al. | 252/62.3 S |
| 3,417,301 | 12/1968 | Galli et al. | 357/16 X |
| 3,674,552 | 7/1972 | Heywang et al. | 148/175 X |
| 3,723,177 | 3/1973 | Toyama et al. | 427/87 |
| 3,929,556 | 12/1975 | Pandey | 156/614 X |

OTHER PUBLICATIONS

Rolls et al., "Preparation — Lead-Tin Telluride Photodiodes" Solid-State Electronics, vol. 13, 1970, pp. 75–81.
Manasevit et al., "Use of Metal-Organics —Semiconductor Materials" J. Electrochem. Soc., vol. 116, No. 12, Dec. 1969, pp. 1725–1732.
Bylander et al., "Lead Salt Epitaxial Films With Near Bulb Properties" Proc. IEEE (correspondence), Apr. 1965, pp. 395–396.
Manasevit, H. M., "Single-Crystal Gallium Arsenide on Insulating Substrates" Applied Physics Letters, vol. 12, No. 4, Feb. 15, 1968, pp. 156–159.

*Primary Examiner*—L. Dewayne Rutledge
*Assistant Examiner*—W. G. Saba
*Attorney, Agent, or Firm*—H. Fredrick Hamann; G. Donald Weber, Jr.; Robert Ochis

[57] ABSTRACT

A composite comprising a monocrystalline substrate and one or more layers or films of monocrystalline IVA-VIA compounds and/or alloys formed thereon by a chemical vapor deposition process. The composite is formed at a preferred temperature range of approximately 450°-650° C. The IVA-VIA layer(s) are produced by the pyrolysis of a gas mixture containing metalorganic compounds. Where single crystal metallic oxide substrates of rhombohedral structure, such as sapphire, ($\alpha$-Al$_2$O$_3$), or of cubic structure, such as magnesium aluminate (spinel), are used for the growth of monocrystalline lead-containing films such as Pb$_{1-x}$Sn$_x$Te, a nucleation layer of lead is preferably formed on the substrate prior to the pyrolysis of the mixed gaseous reactants.

Using the present process, epitaxial monocrystalline IVA-VIA compounds and/or alloys can be grown on inorganic metal oxide substrates, such as cubic and rhombohedral oxides, on alkali halides and IIA fluorides, and on II-VI and III-V compounds. The compositions of the films can be varied without removing the composites from the deposition apparatus by changing the ratio of the reactant gases and the reaction temperature. The conductivity type (n-type or p-type) of the films also can be controlled without removing the composites from the deposition apparatus by varying the reactant gas compositions and by incorporating a dopant into the reactant mixtures prior to pyrolysis.

15 Claims, 3 Drawing Figures

METALORGANIC CHEMICAL VAPOR DEPOSITION OF IVA VIA COMPOUNDS AND COMPOSITE

The invention described herein was made in the course of or under contract or subcontract thereunder with the Department of the Army.

This is a division, of application Ser. No. 523,599 filed Nov. 11, 1974, now abandoned.

BACKGROUND OF THE INVENTION

1. Field of the Invention

This invention relates to the growth of IVA–VIA compounds and, more particularly, to the growth of composites comprising layers of IVA–VIA compounds and alloys on substrates.

2. Description of the Prior Art

One application of IVA–VIA compounds is to infrared (IR) detectors. To date, various semiconductor materials have been used to form IR detectors, with the result that such detectors presently cover a wide range of the IR spectrum. However, past efforts have been concentrated on extrinsic semiconductors, rather than intrinsic semiconductors, because of the highly advanced technology for these materials, which is primarily the result of transistor technology.

While detectors formed from extrinsic semiconductors can exhibit high D* and high speed, they are generally limited to operation at very low temperatures. Also, a relatively large volume of detector material is usually required in order to absorb sufficient incident radiation for detection. In addition to the obvious restrictions on the miniaturization of detector arrays and the accompanying signal processing circuitry, this large volume causes radiation hardening problems.

In principle, compound semiconductor materials, which are used for most intrinsic detectors, have all the advantages of the elemental (extrinsic) semiconductors and very few of the disadvantages. $Pb_{1-x}Sn_xTe$ (lead tin telluride) and PbTe (lead telluride; $x=0$) are examples of excellent compound/alloy detectors for long wavelength IR. Lead tin telluride, for example, has several advantageous characteristics. Because of its direct energy gap, lead tin telluride does not required impurity to absorb incident photons, with the result that there are additional $10^4 cm^{-3}$ available sites for capturing incident signals. Satisfactory operation with relatively thin detector films on the order of 10 $\mu m$ thickness is thus possible. Also, the composition of lead tin telluride can be altered for tuning to the desired portion of the IR spectrum. A composition of approximately $Pb_{0.8}Sn_{0.2}Te$ ($x = 0.2$) is particularly useful because junction-type photovoltaic detectors using films of this composition provide peak response to infrared radiation in the 10–12 $\mu m$ region.

Some growth techniques which have been used successfully for the formation of single crystal IVA–VIA compounds and alloys on other IVA–VIA compounds and alloys have not been successfully applied to insulating substrates. For example, liquid phase epitaxy (LPE) has not been reported in the growth of IVA–VIA compounds on insulators such as the alkali halides and oxide insulators, presumably because of problems in properly nucleating the IVA–VIA material. Yet there are considerable reports of the use of evaporation and sputtering for growing IVA–VIA materials on insulating halide substrates. This area is reviewed by H. M. Manasevit in *J. Crystal Growth*, vol. 22, pg. 125 et seq. (1974). It should be noted that these processes lead to slow growth rates on insulators, typically less than about 350 A/min. (0.035 micron/min.). This is particularly disadvantageous and impractical for applications where thick films may be required, as in IR detectors. In addition, the composition of the grown film may not be homogeneous, particularly for alloy growth, because the vapor pressures of the source materials are different at a given temperature and must be controlled carefully to produce a film of a desired composition when two or three sources and multi-temperatures are used. Also, the composition of the vapor may differ considerably from that of the source during the evaporation process, since the vapor may consist of elements together with compounds having stoichiometry different from the source, thereby resulting in deposits of non-stoichiometric composition.

As may be thus appreciated, it is highly desirable to have a process which provides (1) a fast rate of growth for IVA–VIA compounds on substrates, (2) multilayer film structures of different compositions and impurity levels and conductivity type without removing the structures from the growth system and (3) large area films of controlled compositions and stoichiometry.

SUMMARY OF THE INVENTION

The instant invention concerns a composite comprising at least one monocrystalline layer or film of IVA–VIA compound or alloy, such as PbTe, $Pb_{1-x}Sn_xTe$, PbS, PbSe and SnTe, on a monocrystalline inorganic cubic or rhombohedral oxide substrate and a chemical vapor deposition process for forming both monocrystalline and polycrystalline composites. The chemical vapor deposition process utilizes the pyrolysis of a gaseous mixture of IVA-containing metalorganic compounds and VIA-containing metalorganic compounds and/or hydrides on the substrate at a temperature preferably within the range 450°–650° C. Below about 450° C film growth rates were found to be quite low; above about 550°–650° C., film deterioration was usually observed on substrates such as NaCl that were not stable at these temperatures. If the film contains lead and the substrate is sapphire or magnesium aluminate (spinel), a layer of lead is preferably formed first on the substrate by pyrolysis of a lead-containing metalorganic compound, followed by pyrolysis of the VIA-containing compounds and then by pyrolysis of appropriate mixtures of IVA- and VIA-containing metalorganic compounds.

By varying the deposition parameters, or by introducing impurities into the gaseous atmosphere, the film conductivity-type is controlled. Composites comprising multilayer films are formed without removing the composite from the deposition system.

DETAILED DESCRIPTION OF A PREFERRED EMBODIMENT

Figure 1:
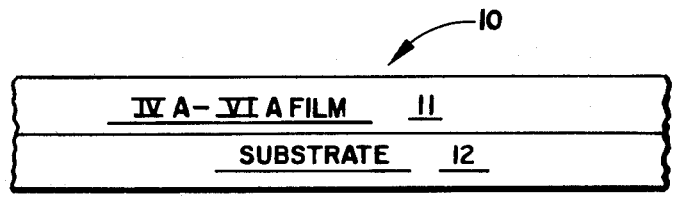
FIG. 1 is a partial, cross-sectional view of a IVA–VIA composite embodying principles of the present invention.

Referring to FIG. 1, there is shown a cross-sectional view of a composite 10 which may be formed according to the method of the present invention. The composite comprises a monocrystalline layer or film 11 of compounds or alloys of groups IVA and VIA of the Periodic Table, such as PbS, PbTe, PbSe, $Pb_{1-x}Sn_xTe$ and SnTe, epitaxially formed on a monocrystalline substrate 12 such as a semiconductor material or insulative material.

Figure 2:
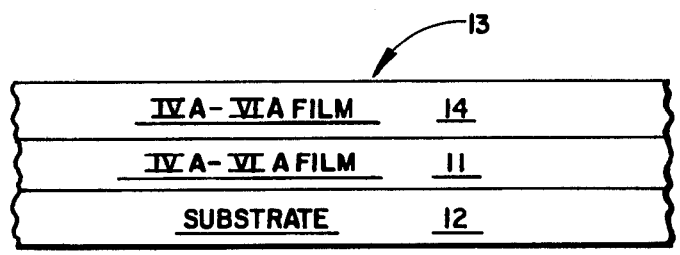
FIG. 2 is a partial, cross-sectional view of an alternative composite embodying princiles of the present invention comprising multilayer films of IVA–VIA compounds.

Referring now to FIG. 2, there is shown a cross-sectional view of a multilayer composite 13 which also may be grown according to the method of the present invention. Typically, the composite 13 comprises the substrate 12, an epitaxial monocrystalline layer or film 11 of lead tin telluride or lead telluride, which is of one conductivity type (such as n-type), formed on the substrate 12, and another epitaxial monocrystalline layer or film 14 of lead tin telluride or PbTe of the opposite conductivity type formed on the layer 22. The applications for this multilayer composite 13 include infrared detectors, as described subsequently.

It will be appreciated that where the IVA-VIA film(s) need not be monocrystalline, the substrate 12 may be amorphous, such as glass or fused quartz, or polycrystalline, such as polycrystalline aluminum oxide.

Figure 3:
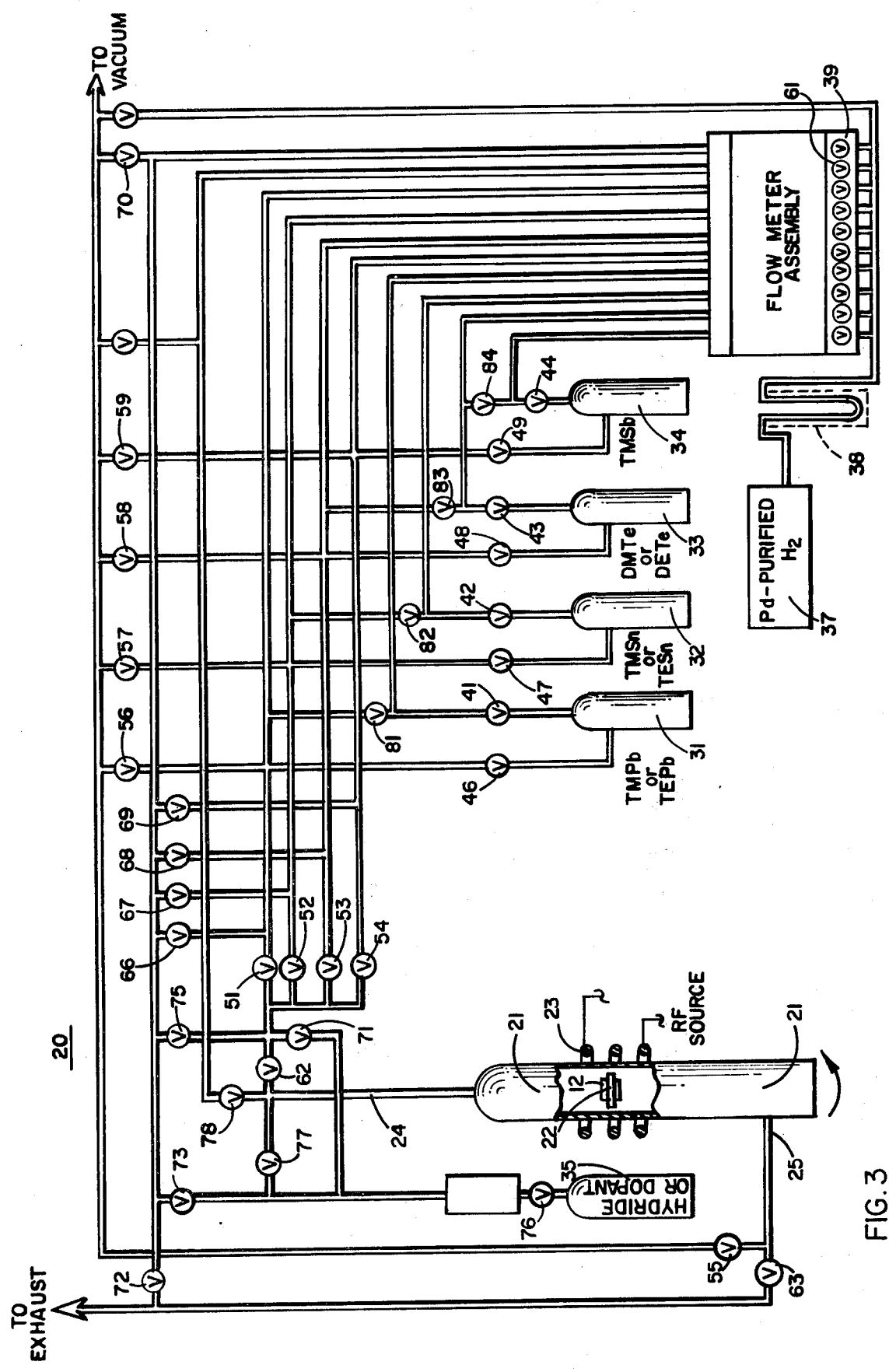
FIG. 3 is a schematic diagram of a reactor system for forming IVA–VIA composites, such as those of FIGS. 1 and 2, in accordance with the method of the present invention.

Referring now to FIG. 3, there is shown a schematic representation of a reactor system 20 which may be utilized to epitaxially form IVA-VIA compounds using the method of the present invention. The reactor typically comprises a quartz reactor chamber 21 containing an SiC-covered carbon pedestal 22 for supporting the substrate 12 (FIGS. 1 and 2) and an RF heating coil 23 which is connected to a power source (not shown). Although the dimensions are not critical, a chamber 21 about 6 cm in diameter by 40 cm in length has been used successfully. The temperature of the pedestal 22 and the substrate supported thereon may be measured by an infrared radiation thermometer (not shown) which may control the power to the coil 23. Means (not shown) may be provided for rotating the substrate, as shown by the arrow, to promote uniform deposition.

The reactant gases which form the IVA-VIA compounds enter the reactor chamber 21 via inlet line 24. Line 25 is used to exhaust the chamber of spent and unused reactants and gases, and to connect the chamber to sources of vacuum and air (not shown). The reactor system 20 uses stainless steel bubbler tanks such as tanks 31, 32 and 33 as needed for supplying the IVA-VIA film constituents, and bubbler tanks such as tank 34 for supplying conductivity-type determining impurities (n-type or p-type dopants). Alternatively, the dopants may be introduced in dilute form from a tank 35 containing the dopants and a carrier gas compatible with the growth process, e.g., $H_2$ or He, if such a dopant mixture is available.

Palladium-purified hydrogen is used as the carrier gas for the film constituents. The carrier gas is flowed from a source 37 through a liquid nitrogen cold trap 38 and through an assembly 39 of valve-controlled flow meters. The purified hydrogen then can be directed at a controlled rate through any or all of valves 41, 42, 43 and 44, respectively, (valves 81, 82, 83 and 84 being closed) into bubbler tanks 31, 32, 33 and/or 34, thereby transporting the desired reactant constituents in the bubblers through tank exit valves 46, 47, 48 and/or 49. The constituents are then transported through valves 51, 52, 53 and/or 54 and, after proper mixing, through valve 62 to inlet line 24 and the reactor chamber 21. The spent reactant gases are exhausted from chamber 21 via lines 25 and valve 63.

Briefly, the process of forming composites 10 (FIG. 1) having layers or films 11 of IVA-VIA compounds or alloys comprises the steps of 1) evacuating the reactor chamber 21; 2) filling and flushing the reactor chamber with flowing hydrogen; 3) heating the pedestal 22 and pedestal-supported substrate 12 to the deposition temperature; 4) equilibrating the flow of gas from the bubbler tanks by connecting the appropriate tanks to exhaust (via valves 66, 67, 68, 69 and 72) and bubbling hydrogen therethrough at a controlled rate to equilibrate the flows at a predetermined ratio; 5) directing reactant gases into the reactor chamber to form the film of IVA-VIA compound or alloy; and 6) cooling the deposition composite to room temperature is hydrogen after diverting the reactant gases from the reactor. The formation of a layer of lead on the substrates prior to deposition per step 5 is an important part of the process for growing continuous, monocrystalline, lead-containing films 11, such as lead telluride and lead tin telluride, on insulative oxide substrates, such as magnesium aluminate and sapphire.

To evacuate the reactor according to step 1, valve 55 is opened to connect the reactor chamber 21 to vacuum. The flow lines up to the valves of the bubbler tanks 31, 32, 33 and/or 34 may also be connected to vacuum and evacuated through valves 56, 57, 58 and 59, respectively prior to filling with $H_2$.

According to step 2, the reactor chamber is purged by flowing hydrogen from tank 37 through flow meter valve 61 and inlet valve 78 to the inlet line 24 and the reactor chamber 21, then exhausting the hydrogen from the chamber through line 25 and exhaust valve 63.

The equilibration of gas flow (step 4) may be initiated simultaneously with the equilibration of the temperature of the pedestal 22 (step 3). That is, while the pedestal is being brought to deposition temperature, the hydrogen gas may be flowed through the bubbler tanks, as described previously, and diverted through valves 51, 52, 53 and 54 (valves 66, 67, 68 and 69 and common vacuum valve 70 are closed) to exhaust and equilibrate the flows through valves 75 and 72 at a predetermined ratio. The flows may be controlled using the valves associated with the flow meter assembly 39.

According to step 5, after the pedestal 22 and substrate 12 are at the deposition temperature and the flow rates have been equilibrated, valve 62 is opened, valve 75 is closed and the gas reactants are directed into the reactor chamber 21. It will be noted that the reactant gases are channeled into a single line, inlet line 24, prior to entering the reactor chamber. By channeling the reactant gases into the single inlet line 24, the gases, which are mixed externally to the heated reactor chamber can be introduced simultaneously into the reactor, thereby precluding an undesirable premature reaction of individual reactants with the heated substrate. Also, the valves 66–69 permit individual setting of the gas reactants prior to their mixing and introduction into the reaction chamber. Moreover, the valves 51–54 permit introduction of individual reactants prior to deposition per step 5 to promote the growth of films on materials such as sapphire and magnesium aluminate, as discussed previously.

After a predetermined deposition time involving step 6, the resulting composite is allowed to cool by shutting off power to the RF heating coil 23 after diverting the reactant gases from the reactor chamber 21 and through valves 66–69, 75 (with valve 62 closed), and 72. At the same time, hydrogen is still flowing through the reactor chamber via valves 61, 78, and 63, thereby cooling the sample in flowing carrier gas.

When the reactants and sources of dopant are normally gaseous at room temperature or are sufficiently volatile so that transport by a carrier gas may be considered optional, step 4 of the process can involve equilibrating the flows of these reactants or sources of dopants supplied by tank 35 with the other reactants by connection to the flow system via valve 71. If it is preferred that members of the reactant mixture meet in inlet line 24 of the reactor via separate lines, then the appropriate flows can be directed through valve 77 after adjusting the flows using flowmeter valve 76 and exhaus valve 73, which is closed immediately after valve 71 or 77 is opened. At the end of the deposition, the valve positions are reversed in order to remove (exclude) the reactant gases from the reactor.

FIG. 3 is used for purposes of illustration and instruction as to technique. Modifications in the design are within the capabilities of those skilled in the area of chemical vapor deposition.

SUBSTRATES

The Group II fluorides, particularly $BaF_2$, are of considerable interest as substrates for IVA-VIA compounds because their thermal expansions approximate those of the IVA-VIA compounds, and because they are essentially transparent to 10–12 $\mu$m radiation in thin wafer form. $BaF_2$ considered an excellent substrate for IVA-VIA IR detectors at these wavelengths. Also, the insulative metallic oxides sapphire, magnesium oxide (MgO), and magnesium aluminate have properties which make them of interest as substrates for IVA-VIA compounds which can be used as detectors in the 3–5 $\mu$m range. For example, except for MgO, they are more stable than fluorides in the atmospheres used for the growth of the films.

$BaF_2$ and $CaF_2$ were used primarily in the form of cleaved (111)-oriented wafers made from crystal ingots, although some polished $BaF_2$ substrates of (111) orientation and (100) orientation which were prepared from (111) oriented crystal ingots were successfully used for monocrystalline film growth. The (111)-oriented $BaF_2$ and $CaF_2$ crystal ingots were typically about one inch in diameter and up to one inch in length and were used to form substrates of about 0.020 to 0.030 inch thickness.

In addition to the above, single crystal alkali halides, represented by NaCl, II-VI compounds, represented by CdTe, III-V compounds, represented by GaAs, and IV-VI compounds, represented by PbTe, were used as substrates for the epitaxial growth of the IV-VI compounds. The alkali halides were cleaved just prior to use; the CdTe was a single crystal film grown on a sapphire ($\alpha$-$Al_2O_3$) substrate; and the GaAs were (100) and (111)-oriented single crystal substrates, which were polished by chemical-mechanical means, and as-grown (111)-oriented films on sapphire. PbTe substrates (see Table II, composite type nos. 12 and 13) were polished by chemical-mechanical means and were oriented to expose a (100) plane.

In general it can be expected that the process can be used to produce IVA-VIA films on IVA-VIA substrates which possess similar lattice parameters. See, e.g., the above-mentioned article in *J. Crystal Growth* authored by one of the present inventors which is hereby incorporated by reference. The various metalorganic compounds used for IVA-VIA film growth are listed in Table I below.

TABLE I
METALORGANIC COMPOUNDS USED IN DEPOSITION OF IVA-VIA FILMS

| Compound | Abbreviation | Formulation |
| --- | --- | --- |
| Tetramethyllead | TMPb | $(CH_3)_4Pb$ |
| Tetraethyllead | TEPb | $(C_2H_5)_4Pb$ |
| Tetramethyltin | TMSn | $(CH_3)_4Sn$ |
| Tetraethyltin | TESn | $(C_2H_5)_4Sn$ |
| Dimethyltellurium | DMTe | $(CH_3)_2Te$ |
| Diethyltellurium | DETe | $(C_2H_5)_2Te$ |
| Trimethylantimony | TMSb | $(CH_3)_3Sb$ |

Hydrogen telluride ($H_2Te$) is a suitable substitute for DMTe as a source of Te.

PbTe FILMS/SAPPHIRE AND MAGNESIUM ALUMINATE (SPINEL) SUBSTRATES

Here, tetraethyllead, TePb, and dimethyltellurium, DMTe, were used as the source of Pb and Te, respectively, in the stainless steel bubbler tanks 31 and 33. Polished, (0001)-oriented sapphire and polished, (111)-oriented magnesium aluminate were used as substrates 12 (FIG. 1).

After evacuating the reactor chamber 21 (step 1) and filling the reactor chamber with hydrogen flowing at approximately 10 liters per minute (1 pm), (step 2), the pedestal 22 was heated by the RF coil 23 to within the desired deposition temperature range of approximately 450°–650° C. Hydrogen flow rates of approximately one 1pm through the TEPb and 25–75 ccpm through the DMTe were used.

To promote rapid growth of continuous, monocrystalline PbTe films 11 (FIG. 1) on the sapphire and magnesium aluminate substrates 12, the substrate was nucleated with a thin deposit of lead prior to the onset of PbTe deposition. Typically, this was achieved within the preferred deposition temperature range of approximately 450°–650° prior to step 5 (or as an initial substep of step 5) by 1) introducing TEPb alone into the reactor chamber 21 to deposit Pb on the heated substrate, 2) next introducing DMTe alone into the reaction chamber, and 3) followed by the reintroduction of TEPb together with the DMTe into chamber 21, according to step 5.

More specifically, valves 51 and 62 were opened and valve 66, which had been open to exhaust the TEPb during flow equilibration (step 4), was closed, in order to direct TEPb alone into the reactor chamber 21. As mentioned previously, a hydrogen carrier gas flow rate of one 1pm was used for the TEPb. After about one minute at this flow rate, sufficient Pb growth occurred to form a Pb deposit. Next valve 66 was opened to direct the TEPb to exhaust and valve 51 was closed. Valve 53 was then opened to introduce DMTe into the reactor through valve 62 with valve 68 closed. The DMTe converts Pb to PbTe and/or provides a tellurium rich atmosphere. A hydrogen flow rate through the DMTe of about 45 ccpm was used. After about five minutes of DMTe flow, TEPb was reintroduced into the reactor chamber in the carrier gas in the presence of DMTe (step 5) and PbTe was formed in the presence of the Te rich atmosphere.

TABLE II

CRYSTALLOGRAPHIC RELATIONSHIPS, IVA-VIA FILMS AND SUBSTRATES

| COMPOSITE TYPE NO. | SUBSTRATE PLANE | PARALLEL PLANES | PARALLEL DIRECTIONS |
|---|---|---|---|
| 1 | (0001) $\alpha$-Al$_2$O$_3$ | (111) PbTe // (0001) Al$_2$O$_3$ | [$\bar{1}$10] PbTe // [$\bar{1}2\bar{1}$0] Al$_2$O$_3$ |
| 2 | (111) MgAl$_2$O$_4$ | (111) PbTe // (111) MgAl$_2$O$_4$ | [$2\bar{1}\bar{1}$] PbTe // [$\bar{1}0\bar{1}$] MgAl$_2$O$_4$ |
| 3 | (111) BaF$_2$ (cleaved) | (111) PbTe // (111) BaF$_2$ | [1$\bar{1}$0] PbTe // [0$\bar{1}$1] BaF$_2$ |
| 4 | (100) NaCl | (100) PbTe // (100) NaCl | not determined |
| 5 | (100) MgO | (100) PbTe // (100) MgO | not determined |
| 6 | (0001) $\alpha$-Al$_2$O$_3$ | (111) PbS // (0001) Al$_2$O$_3$ | [$\bar{1}$10] PbS // [$\bar{1}2\bar{1}$0] Al$_2$O$_3$ |
| 7 | (111) BaF$_2$ (cleaved) | (111) PbS // (111) BaF$_2$ | [1$\bar{1}$0] PbS // [0$\bar{1}$1] BaF$_2$ |
| 8 | (111) CaF$_2$ | (111) PbS // (111) CaF$_2$ | [1$\bar{1}$0] PbS // [0$\bar{1}$1] CaF$_2$ |
| 9 | (0001) $\alpha$-Al$_2$O$_3$ | (111) PbSe // (0001) Al$_2$O$_3$ | [$\bar{1}$10] PbSe // [$\bar{1}2\bar{1}$0] Al$_2$O$_3$ |
| 10 | (111) BaF$_2$ | (111) PbSe // (111) BaF$_2$ | [1$\bar{1}$0] PbSe // [0$\bar{1}$1] BaF$_2$ |
| 11 | (111) CaF$_2$ | (111) PbSe // (111) CaF$_2$ | [1$\bar{1}$0] PbSe // [0$\bar{1}$1] CaF$_2$ |
| 12 | (100) PbTe | (100) PbTe // (100) PbTe | not determined |
| 13 | (100) PbTe | (100) Pb$_{0.8}$Sn$_{0.2}$Te // (100) PbTe | not determined |

After the film 12 of PbTe was deposited, the gas reactant mixture was diverted from the reactor chamber 21 and the sample was cooled in hydrogen flowing at about one lpm (step 6).

The PbTe films were grown to about 5 $\mu$m thickness on the sapphire and magnesium aluminate substrates. The films were determined to be monocrystalline using x-ray analysis. The crystallographic relationships between the PbTe films and aumina and spinel substrates are summarized in Table II, under composite type numbers 1 and 2. Growth parameters are summarized in Table III, also under composite type numbers 1 and 2.

PbTE FILMS/BaF$_2$ SUBSTRATES

PbTe films were grown on single crystal BaF$_2$ substrates using TEPb or TMPb and DMTe as the reactants. Some substrates were used as-cleaved, without polishing.

Monocrystalline film growth on the cleaved, (111)-oriented BaF$_2$ substrates was achieved using TEPb as the source of Pb at predestal temperatures of 450°–600° C. Specifically, temperatures of 450, 500, 560, 575 and 600° C were utilized. Somewhat higher temperatures can also be expected to be consistent with single crystal growth. Also, the range of 500°–600° C provided a growth rate (0.08 $\mu$m/min. or 5 $\mu$m/hr. for the stated parameters) which was approximately twice that achieved at 450° C.

The PbTe films were grown to a thickness of approximately 5 microns. X-ray diffraction measurements showed the PbTe films were monocrystalline. The film-substrate crystallographic relations for PbTe films grown on the cleaved, (111)-oriented BaF$_2$ are indicated in Table II under composite type no. 3. The growth parameters described above are summarized in Table III under composite type no. 3A.

TABLE III
GROWTH PARAMETERS FOR IVA-VIA FILMS

| Sample Composite Type No. | 1 | 2 | 3A | 3B | 3C | 3D | 3E | 3F | 3G | 3H | 3I | 3J | 3K | 3L |
|---|---|---|---|---|---|---|---|---|---|---|---|---|---|---|
| Substrate | (0001) Al$_2$O$_3$ | (111) MgAl$_2$O$_4$ | | | | | (100) NaCl | (100) MgO | (0001) Al$_2$O$_3$ | (111) BaF$_2$ PbS | (111) CaF$_2$ | (0001) Al$_2$O$_3$ | (111) BaF$_2$ PbSe | (111) CaF$_2$ |
| Film | | | PbTe (%=0) | | | | | (111) BaF$_2$ Pb$_{1-x}$Sn$_x$Te | | | | | | |
| | | | | | | | PbTe (x=0) | x≈0.2 | 0.2≦x≦0.5 | x=0.2 | x=0.2 | NOT CHARACTERIZED | | x=0.21 |
| Deposition Temp (°C) | 500-600 | 500-600 | 450-600 | 625 | 625 | 625 | 500-550 | 500-550 | 550-625 | | | 625 | | |
| Carrier Gas Flow Rate (ccpm) | | | | | | | | | | | | | | |
| TMPb | | | | 50 | 100 | 200 | 200 | | 50 | 50 | 50 | 50 | 50 | 50 |
| TEPb | 1000 | 1000 | 1000 | | | | | 1000-750-2000 | 1000-3000 | 2000 | 2000 | 2000 | 2000 | 2000 |
| TESn | 25-75 | 25-75 | 50 | 75 | 75 | 75 | 35 | 25 | 75-150 | 75 7 | 75 20 | 75 26 | 75 50 | 75 125 |
| DMTe | | | | | | | | | | | | | | |
| TMSb | | | | | | | | 1000 | | | | | | |
| Flow Rate (ccpm) | | | | | | | | 25 | | | | | | |
| H$_2$S | | | | | | | | | | | | | | |
| H$_2$Se | | | | | | | | | | | | | | |
| Growth Rate (µm/hr) | ~8 ~5 | ~8 ~5 | ~5 ~5 | 4.5 2.6 | 11 13.8 | 32 16.0 | 24 4.6 | 7-8 | 7-23 15 | 18 8 | 25 25 | 22 11 | 27 13 | 24 18 |
| Film Thickness (µm) | | | | | | | | | | | | | | |
| Film Conductivity Type | p | p | p | p | p | n | p | — | — | p | p | n | n | n |
| Electrical Properties | | | | | | | | | | | | | | |
| Resistivity (ohm-cs) | — | — | — | 0.1 | .0057 | 0.14 | 0.05 | — | 0.0014* | 0.002 | 0.002 | 0.004 | 0.0008 | 0.0004 |
| Carrier Concentration (cm$^{-3}$) | — | — | — | 1.2×10$^{17}$ | 1.8×10$^{12}$ | 5.3×10$^{16}$ | 2.0×10$^{19}$ | — | 9.5×10$^{18}$ | 6.9×10$^{18}$ | 3.0×10$^{19}$ | 1.5×10$^{19}$ | 8.1×10$^{18}$ | 2.5×10$^{19}$ |
| Mobility (cm$^2$/V-sec.) | — | — | — | 84 | 632 | 505 | 886 | — | 470* | 440 | 101 | 933 | 904 | 620 |

| Sample Composite Type No. | 4 | 5 | 6 | 7 | 8 | 9 | 10 | 11 |
|---|---|---|---|---|---|---|---|---|
| Substrate | (100) NaCl | (100) MgO | (0001) Al$_2$O$_3$ | (111) BaF$_2$ PbS | (111) CaF$_2$ | (0001) Al$_2$O$_3$ | (111) BaF$_2$ PbSe | (111) CaF$_2$ |
| Film | | | | | | | | |
| Deposition Temp (°C) | 500-550 | 500-550 | | 550 | | | | |
| Carrier Gas Flow Rate (ccpm) | | | | | | | | |
| TMPb | | | 100 | 100 | 100 | 100 | 100 | 100 |
| TEPb | 1000 | 1000 | | | | | | |
| TESn | | | | | | | | |
| DMTe | 25 | 25 | | | | | | |
| TMSb | | | | | | | | |
| Flow Rate (ccpm) | | | | | | | | |
| H$_2$S | — | — | ~10 | ~10 | ~10 | ~10 | ~10 | ~10 |
| H$_2$Se | — | — | | 6-18 | | | 6-18 | |
| Growth Rate (µm/hr) | — | — | 7.4 | 20 | ~20 | 32 | 25 | ~25 |
| Film Thickness (µm) | — | — | — | — | — | — | — | — |

*H$_2$ flow rates of 50, 2000, 75 ccpm through TMPb, TESn and DMTe, resp.; temp. 625° C.
— indicates data not taken Similar results were obtained using TMPb as the source of Pb, as shown below, except that growth rates could be increased considerably.

The metalorganic CVD process of the present invention was used successfully to vary the conductivity type. That is, both n- and p-type PbTe films were formed on cleaved (111) BaF$_2$ substrates. Here, TMPb and DMTe were the sources of lead and tellurium. In these examples, the n-type and p-type films were obtained by varying the TMPb to DMTe ratio. See Table III, composite type no's. 3B–3E. For composite type no. 3D, hydrogen flow rates of 200 ccpm through the TMPb and 75 ccpm through the DMTe gave a TMPb:DMTe flow rate ratio of about 3:1, and provided a high film growth rate of about 32 microns per hour and a very high quality, monocrystalline n-type (presumably metal rich) PbTe film. However, for high TMPb concentrations and low DMTe concentrations, p-type films were formed, perhaps due to a high defect structure. Thus, composite type no. 3E was p-type, when the DMTe flow was lowered from 75 to 35 ccpm. Varying the ratios of TEPb and DMTe can thus be expected to yield n- and p-type films with controllable properties.

N-type on p-type and p-type on n-type multilayer films and junctions were formed by varying the ratios of the Group IVA and VIA reactants.

PbTe FILMS/NaCl SUBSTRATES

The method and metalorganic constituents used for the formation of PbTe films on BaF$_2$ substrates were used to form monocrystalline PbTe films on (100)-oriented NaCl substrates. Here, deposition was attempted and achieved at temperatures in the range of 500°–625° C. The crystallographic relationships of the PbTe films and NaCl substrates are listed in Table II under composite type no. 4. Growth parameters are listed in Table III, also under composite type no. 4, for samples grown within the approximate range 500°–550° C. This range produced better quality films on NaCl than higher temperatures. The NaCl substrates appeared to be unstable at higher temperatures.

PbTe FILMS/MgO SUBSTRATES

The method and metalorganic constituents used for the formation of PbTe/BaF$_2$ and PbTe/NaCl composites were also used to form monocrystalline PbTe films on MgO substrates. The crystallographic relationships and growth parameters are listed in Table II and III under composite type no. 5. As was true for PbTe/naCl composites, better quality films were produced within the range 500°–550° C than at higher temperatures.

Similar results can be expected when TMPb is used as a substitute for TEPb.

PbTe FILMS/GaAs, GaAs-on-Al$_2$O$_3$ and CdTe-on-Al$_2$O$_3$ SUBSTRATES

The method and metalorganic constituents used for the formation of PbTe films on BaF$_2$ and NaCl substrates were used to form epitaxial PbTe films on polished (100) and (111)-oriented GaAs substrates, on (111) GaAs films grown on (0001) Al$_2$O$_3$; and on (111) CdTe films grown on (11$\bar{2}$6) Al$_2$O$_3$. Typical flow rates of 50–200 ccpm for TMPb and 75–100 ccpm for DMTe were used at growth temperatures of 500 and 625° C to form films which were very highly ordered with respect to the underlying substrate. Because lead telluride (PbTe) is representative of lead tin telluride (Pb$_{1-x}$Sn$_x$Te), lead tin telluride can be grown on substrates which are suitable for PbTe growth. Thus, using similar conditions and, of course, a source of tine, such as TESn, lead tin telluride can be grown on the above-described substrates.

PbS AND PbSe FILMS

The method of the present invention was also used to form monocrystalline, continuous films of PbS and PbSe on polished (0001) Al$_2$O$_3$, cleaved (111) BaF$_2$, and cleaved (111) CaF$_2$ substrates using a 550° C deposition temperature. The Group VIA source was H$_2$S and H$_2$Se. The crystallographic relationships for the PbS/(0001) Al$_2$O$_3$, PbS/(111)BaF$_2$, Pbs/(111)CaF$_2$, PbSe/(0001)Al$_2$O$_3$, PbSe/(111)BaF$_2$ and PbSe/(111)CaF$_2$ film-substrate composites are listed in Table II, under composite type no's. 6–11, respectively. The growth parameters are listed in Table III under composite type no's 6–11.

Referring to Table III, the PbS films for composite types 6–8, and the PbSe films for composite types 9–11 were formed from TMPb and, respectively, H$_2$S and H$_2$Se. The H$_2$S and H$_2$Se were supplied from tank 35, which is connected to the reactor system through valves 76 and 77 or 76, 71 and 62. Valve 73 or 75 is used to equilibrate the flows from tank 35 prior to introduction into line 24 and reactor 21. Valve 75 is also used in mixing the H$_2$S or H$_2$Se (a carrier gas is optional) from tank 35 with the carrier gas-transported reactants from the bubbler tanks prior to entry into the reactor chamber 21 (step 5).

When the substrate is stable to the Group VIA reactants at the growth temperature and the product of decomposition does not form a deposit on or react with the substrate surface, the Group VIA reactant can be introduced into the reactor prior to the introduction of the Group IVA reactants. For example, reaction of BaF$_2$ with DMTe precluded introducing DMTe into the reactor prior to the introduction of TEPb or TMPb and mixing of the reactant gases external to the reactor was, therefore, required. In the case of the Group VIA hydrides, namely H$_2$S and H$_2$Se, which did not appear to react with BaF$_2$, it was sufficient to introduce the VIA containing reactants either singly or together into the reactor prior to the introduction of the metallorganic Pb and/or Sn compounds. Referring to FIG. 3, in the latter case, the Group VIA component would pass through valve 77 into reactor 21 prior to the admittance of the Group IVA component(s) through valve 62.

It will be appreciated by those skilled in the art that pyrolysis of mixtures of the hydrides of S and Se with the Group IVA components will form Group IVA-S$_{1-x}$Se$_x$ compounds such as PbS$_{1-x}$Se$_x$ or Sn S$_{1-x}$Se$_x$.

Pb$_{1-x}$Sn$_x$Te FILMS/BaF$_2$ SUBSTRATES

Lead tin telluride films were grown on cleaved, (111)-oriented BaF$_2$ substrates at deposition temperatures of 550°–625° C using essentially the lead telluride-on-barium fluoride deposition method with the added film constituent —tin— being supplied by TESn from stainless steel bubbler tank 32. Film growth of composition $x = 0$ to $x = 0.2$ was achieved for hydrogen flow rates through the TESn of up to 2000 ccpm. (As the hydrogen flow rate through the TESn is decreased to zero, the film composition approaches that of lead telluride). Using a hydrogen flow rate of 25 ccpm through the DMTe and 1000 ccpm through the TEPb, the desired composition for detector devices, Pb$_{0.8}$Sn$_{0.2}$Te or $x = 0.2$, was closely approximated over a wide range of hydrogen flow rates (approximately 750–2000 ccpm) through the TESn. Precisely the desired composition was achieved for hydrogen flow rates through the TESn of 850 and 900 ccpm. Growth rates using the temperature range 550°14 625° C and the range of hydrogen flow rates of 750–2000 ccpm were aproximately 7 to 8 microns per hour. See Table III, composite type No. 3F.

Lead tin telluride films were also grown using TMSn in place of TESn. However, the TMSn was considerably less efficient than TESn for the deposition temperature used, 550°–600° C.

Referring to Table III, composite type No. 3G, growth rates of about 7-23 μm/hr. were obtained over the temperature range 550°–625° C using TMPb in place of TEPb, for a DMTe flow rate of 75–150 ccpm, a TESn flow rate of 3000 ccpm, and a TMPB flow rate of approximately 50 ccpm. Growth rates increased with temperatures in the range 550°–625° C. However, at the higher temperatures, the value of $x$ increased. To control the film composition to $x = 0.2$ at 625° C it was necessary to use a TESn flow rate of about 2000 ccpm, indicated below.

For hydrogen flow rates through the respective reactants TMPb, TESn and DMTe of 50, 2000 and 75 ccpm and a pedestal temperature of 625° C, a film of composition $Pb_{0.80}Sn_{0.20}Te$ was grown to a thickness of approximately 15 micron at a growth rate of about 23 micron per hour on (111) $BaF_2$ substrates. The film possessed excellent electrical properties at room temperatures: resistivity was approximtely 0.0014 ohm-cm; hole concentration was $9.5 \times 10^{18} cm^{-3}$; mobility was about 470 $cm^2$/V-sec; and the band-gap energy was about 0.23 eV.

Sawed and polished (111) $BaF_2$ wafers were also used as substrates. The appearance of lead tin telluride films grown on polished $BaF_2$ substrates was inferior to those grown on freshly cleaved $BaF_2$, but the electrical properties were essentially the same.

Using the foregoing informtion, those skilled in the art will achieve film compositions within the range $0 \leq X \leq 0.5$.

VARIED CONDUCTIVITY-TYPE $Pb_{1-x}Sn_xTe$ FILMS

The conductivity type of lead tin telluride films was changed by varying the DMTe flow rate and growth temperature. As shown by the datain Table III, alkyl antimony compounds such as TMSb can also be used as a source of n-type doping impurity to vary the conductivity type of lead tin telluride. Referring to FIG. 3, TMSb was stored at −78° C in the stainless steel bubbler tank 34. Hydrogen was used to transport the TMSb for mixing with the other reactants externally to the reactor chamber 21.

As shown by composite nos. 3H–3L in Table III, increasing the TMSb flow rate changes the film from p-type to n-type. The TMSb flow rate at which this type change occurs is dependent upon the other parameters, such as TMPb, TESn and DMTe flow rates and film growth temperature. Table III indicates the film composition can be closely controlled and that electrical properties for the p-type and n-type films are generally excellent.

Considerable tensile stress was present in PbTe and $Pb_{1-x}Sn_xTe$ films grown on $BaF_2$ substrates, mainly because of the large difference between the thermal expansion coefficients of the film materials and the $BaF_2$ substrate material. To illustrate, $BaF_2$ and PbTe have coefficients of approximately $18 \times 10^{-6}$/° C and $27 \times 10^{-6}$/° C, respectively. However, despite the existence of stress, $Pb_{0.8}Sn_{0.2}Te$ films 100 microns thick were grown on $BaF_2$ substrates without evidence of cracking. Such composites may be useful as strain gauges, etc.

DOUBLE LAYER $Pb_{1-x}Sn_xTe$ FILMS/$BaF_2$ SUBSTRATES

Referring now to FIG. 2 using a cleaved, (111)-oriented $BaF_2$ substrate 12, a first, undoped p-type layer 11 of $Pb_{0.8}Sn_{0.2}Te$ was epitaxially formed on the substrate, then a second $Pb_{0.8}Sn_{0.2}Te$ layer 14 doped with Sb was grown on the first layer. Both layers were formed using the method of the present invention, as described previously. The double layer, $Pb_{0.8}Sn_{0.2}Te$ film-$BaF_2$ substrate composite 13 was processed into a mesa diode (not shown) by standard photolithographic techniques. Ohmic contact was provided by vacuum deposition of a one micron thick film of Sn on the surface of the upper layer 14. An infrared photovoltaic effect of about 25 mv was observed at 77° K.

Sn-VIA FILMS

The reaction of TESn with DMTe, $H_2S$ and $H_2S$ was used to form Sn-VIA compound films. For each film, the new $H_2$ flow through the TESn was kept constant at 2000 ccpm. The flow through DMTe and the $H_2S$ and $H_2Se$ flows were arbitrarily set at 75 ccpm, ~25 ccpm, and ~50 ccpm, respectively.

Within the temperature range ~500°–650° C, ordered growth of SnTe was obtained on the substrates examined, cleaved (111) $BaF_2$ and polished (100) PbTe. Considerable trigonal structure usually associated with (111) growth was obtained on the $BaF_2$, particularly near the edges of the substrate. Growth on (100) PbTe produced a large array of islands oriented with respect to each other and the substrate. Large crystallites with parallel faces and, in some cases prominant hollow centers grew at the edges of the PbTe substrates under these less-than-optimum growth conditions.

S and Se chalcogenides of tin were grown over the deposition temperature range of ~500°–575° C. Above 575° C, e.g. at 600° C, film quality decreased. The VIA constituents S and Se were provided by $H_2S$ and $H_2Se$, respectively, using arbitrarily-chosen flow rates of ~25 and ~50 ccpm, respectively.

The nature of the growth of the S and Se chalcogenides of Sn, which possess an orthorhombic structure, was not like that of cubic SnTe. Tinsulfide films, ~3μm thick, grown at 550° C simultaneously on cleaved $BaF_2$ and $CaF_2$ tended to peel from the $BaF_2$ but adhered to the $CaF_2$. At 500° C tin selenide grew as crystallites on $BaF_2$. An orienting influence of the substrate was suggested by the parallelism and 60 degree symmetry displayed by many of the crystallites. In the early growth stages the films possessed a yellow-orange color; thicker films were grey. Crystallite growth of both compounds was obtained on (0001) $Al_2O_3$.

Continuous film growth of the tin-VIA compounds on sapphire can be expected if the surface is nucleated with Sn prior to the growth of the tin-VIA compounds, as previously described for PbTe growth on sapphire and magnesium aluminate.

Thus, there has been described a method of growing IVA–VIA films on insulative and semiconducting substrates. Examples of the method of growth, of the film-substrate composites formed thereby, and of applications for the composites have been described. However, the scope of the invention is limited only by the appended claims.

Having thus described a preferred embodiment, what is claimed is:

1. A method for forming a layer of Group IVA–VIA material on an amorphous substrate of glass or fused quartz or a monocrystalline or a polycrystalline substrate selected from the group consisting of Group IA - Group VIA compounds, Group II - Group VI compounds Group IIA- Fluorides, Group IIIA - Group VA compounds and Group IV - Group VI compounds, α-$Al_2O_3$ and $MgAl_2O_4$, comprising the steps of:
   establising a heated deposition zone at a temperature within the range 400°–700° C and encompassing a deposition surface of said substrate;
   forming a gaseous mixture of metalorganic IVA-containing and VIA-containing components; and
   pyrolyzing said mixture within said heated deposition zone.

2. A method for forming a layer of Group IVA-VIA material on a substrate as defined in claim 1 wherein:
   the layer of IVA–VIA material is a monocrystalline layer of PbS or PbSe;
   the Group VIA containing component is selected from $H_2S$ or $H_2Se$; and
   the Group VIA-containing component is introduced into the heated deposition zone prior to introduction of the Group IVA-containing component.

3. A method for forming a layer of Group IVA–VIA material on a substrate as defined in claim 1, wherein the substrate is a monocrystalline Group IA–VIIA material.

4. A method for forming a layer of Group IVA–VIA material on a substrate as defined in claim 1, wherein the substrate is a monocrystalline Group IIA-fluoride material.

5. A method for forming a layer of Group IVA–VIA semiconductor on a substrate as defined in claim 1, wherein the substrate and layer are monocrystalline, the group IVA–VIA material is selected from lead telluride and lead tin telluride, and the substrate is selected from α-$Al_2O_3$ and magnesium aluminate, the method further comprising the step of forming a layer of Pb on the deposition surface of the substrate prior to the formation of lead telluride or lead tin telluride.

6. The method for forming a layer of Group IVA–VIA semiconductor material on a substrate as defined in claim 1, wherein the Group IVA–VIA material is a tin-VIA material and the substrate is selected from α-$Al_2O_3$ and magnesium aluminate the method further comprising the step of forming a layer of tin on the deposition surface of the substrate prior to the formation of the tin-VIA material.

7. The method defined in claim 6 wherein the VIA constituent of the tin-VIA material is at least one element selected from the group consisting of sulfide, selenide and telluride.

8. A method for epitaxially forming at least one monocrystalline layer of IVA–VIA semiconductor material on a deposition surface of a monocrystalline substrate selected from the group consisting of Group IA - Group VIA compounds Group II - Group VI compounds, Group IIA - Fluorides, Group IIIA - Group VA compounds and Group IV - Group VI compounds, α- $Al_2O_3$ and $MgAl_2O_4$, said IVA constituent being selected from Pb and Sn and said via constituent being selected from S, Se and Te, the method comprising the step of:
   establishing a heated, deposition zone at a temperature within the range 450° – 650° C and encompassing the deposition surface of the substrate:
   forming a gaseous mixture of IVA-containing compounds selected from the group consisting of tetraethyllead, tetramethyllead, tetramethyltin, tetraethyltin, and of VIA-containaing compounds selected from the group consisting of dimethyltellurium, $H_2Te$, diethyltellurium, hydrogen sulfide, and hydrogen selenide; and
   pyrolyzng said gaseous mixture within said deposition zone.

9. A method for epitaxially forming at least one monocrystalline layer of IVA–VIA semiconductor material on a deposition surface of a monocrystalline substrate as defined in claim 8, wherein the VIA-containing compound is hydrogen sulfide or hydrogen selenide and is introduced into the deposition zone prior to the introduction of the IVA-containing compound.

10. The method defined in claim 8, further comprising the steps of;
   varying the ratio of said IVA-containing and VIA-containing compounds in said mixture to form layers of different compositions; and
   selectively introducing conductivity-type determining impurities into said gaseous mixture.

11. The method defined in claim 10 wherein the conductivity-type determining impurity is Sb and is supplied by a metalorganic alkyl compound of Sb.

12. The method defined in claim 10 wherein the monocrystalline substrate is selected from the group consisting of Group IA-VIIA, Group IIA-fluoride, Group IIIA–VA, and Group IIB–VIA materials.

13. The method recited in claim 1 wherein said substrate is monocrystalline.

14. The method recited in claim 1 wherein said substrate is polycrystalline.

15. The method recited in claim 1 wherein said substrate is amorphous.

* * * * *